(12) United States Patent
Puma et al.

(10) Patent No.: US 8,053,890 B2
(45) Date of Patent: Nov. 8, 2011

(54) MICROCHIP ASSEMBLY INCLUDING AN INDUCTOR AND FABRICATION METHOD

(75) Inventors: Giuseppe Li Puma, Bochum (DE); Dietolf Seippel, Bottrop (DE)

(73) Assignee: Infineon Technologies AG, Munich (DE)

( * ) Notice: Subject to any disclaimer, the term of this patent is extended or adjusted under 35 U.S.C. 154(b) by 529 days.

(21) Appl. No.: 11/641,604

(22) Filed: Dec. 19, 2006

(65) Prior Publication Data
US 2008/0130257 A1 Jun. 5, 2008

(30) Foreign Application Priority Data
Dec. 5, 2006 (DE) .................. 10 2006 057 332

(51) Int. Cl.
*H05K 7/00* (2006.01)
(52) U.S. Cl. ........ 257/734; 257/668; 257/774; 257/531; 257/723; 257/686; 257/777; 361/782; 29/592.1
(58) Field of Classification Search .................. 257/734, 257/668, 774, 531, 723, 686, 777; 361/782; 29/592.1
See application file for complete search history.

(56) References Cited

U.S. PATENT DOCUMENTS

| | | | | |
|---|---|---|---|---|
| 6,162,697 A * | 12/2000 | Singh et al. | ................... | 438/381 |
| 6,183,669 B1 * | 2/2001 | Kubota et al. | .............. | 156/89.16 |
| 6,268,777 B1 | 7/2001 | Welch | | |
| 6,338,893 B1 * | 1/2002 | Kodera et al. | ................. | 428/210 |
| 6,501,341 B2 * | 12/2002 | Mashimo | ....................... | 331/96 |
| 6,531,257 B2 * | 3/2003 | Kubota | ....................... | 430/198 |
| 6,630,725 B1 | 10/2003 | Kuo et al. | | |
| 6,713,375 B2 | 3/2004 | Shenoy | | |
| 6,800,936 B2 * | 10/2004 | Kosemura et al. | ............. | 257/748 |
| 6,838,970 B2 | 1/2005 | Basteres et al. | | |
| 6,870,430 B2 * | 3/2005 | Nakamura et al. | ............... | 331/18 |
| 7,173,498 B2 * | 2/2007 | Ramaswamy et al. | ..... | 331/108 C |
| 7,209,011 B2 * | 4/2007 | Welland et al. | .............. | 331/36 L |
| 7,233,055 B2 * | 6/2007 | Grange | ......................... | 257/659 |
| 2003/0036020 A1 * | 2/2003 | Kubota | ......................... | 430/313 |

(Continued)

FOREIGN PATENT DOCUMENTS
EP 0 685 857 B1 9/1999
(Continued)

OTHER PUBLICATIONS

[Power Point Presentation], Zoschke et al., "Design and Fabrication of Integrated Passives in Thin Film Technology," EMI Advanced Packaging Conference 2006, Tuesday Apr. 4, 2006, International Congress Center, Munich Germany.

*Primary Examiner* — A Williams
(74) *Attorney, Agent, or Firm* — Slater & Matsil, L.L.P.

(57) ABSTRACT

An assembly includes a substrate, a chip mounted on the substrate, a voltage controlled oscillator circuit including an inductor and further circuit elements. The inductor is mounted on or in the substrate, and the further circuit elements are mounted on or in the chip. An assembly is disclosed that includes a substrate including a first metallization plane and a second metallization plane, a chip mounted on the substrate, and an inductor mounted on or in the substrate. The inductor includes a first inductor portion in the first metallization plane and a second inductor portion in the second metallization plane. An assembly is also disclosed including a substrate, a chip mounted onto the substrate, and a transformer formed at least in part on or in the substrate.

12 Claims, 6 Drawing Sheets

U.S. PATENT DOCUMENTS

| | | |
|---|---|---|
| 2004/0075170 A1* | 4/2004 | Degani et al. ............... 257/724 |
| 2004/0155715 A1* | 8/2004 | Nakamura et al. ........... 331/158 |
| 2005/0133909 A1 | 6/2005 | Franca-Neto |
| 2005/0212084 A1* | 9/2005 | Grange ........................ 257/537 |
| 2006/0097836 A1* | 5/2006 | Sakamoto .................... 336/200 |
| 2006/0097906 A1* | 5/2006 | Heide ............................ 342/22 |
| 2006/0145805 A1 | 7/2006 | Kim et al. |
| 2006/0197182 A1* | 9/2006 | Degani et al. ............... 257/531 |
| 2007/0021089 A1* | 1/2007 | Terui et al. ................... 455/323 |
| 2007/0046385 A1* | 3/2007 | Forbes et al. ........... 331/107 SL |
| 2007/0275506 A1* | 11/2007 | Yamazaki et al. ............ 438/118 |
| 2007/0290362 A1* | 12/2007 | Hsu et al. ..................... 257/774 |
| 2008/0129390 A1* | 6/2008 | Hung et al. .................... 331/16 |
| 2008/0129394 A1* | 6/2008 | Kissing et al. ................. 331/67 |

FOREIGN PATENT DOCUMENTS

| | | |
|---|---|---|
| EP | 1 128 326 A2 | 8/2001 |
| GB | 2 288 286 A | 10/1995 |
| JP | 2004-327946 A | 11/2004 |
| WO | WO 99/57763 | 11/1999 |
| WO | WO 01/95679 A1 | 12/2001 |
| WO | WO 2006/020873 A1 | 2/2006 |

\* cited by examiner

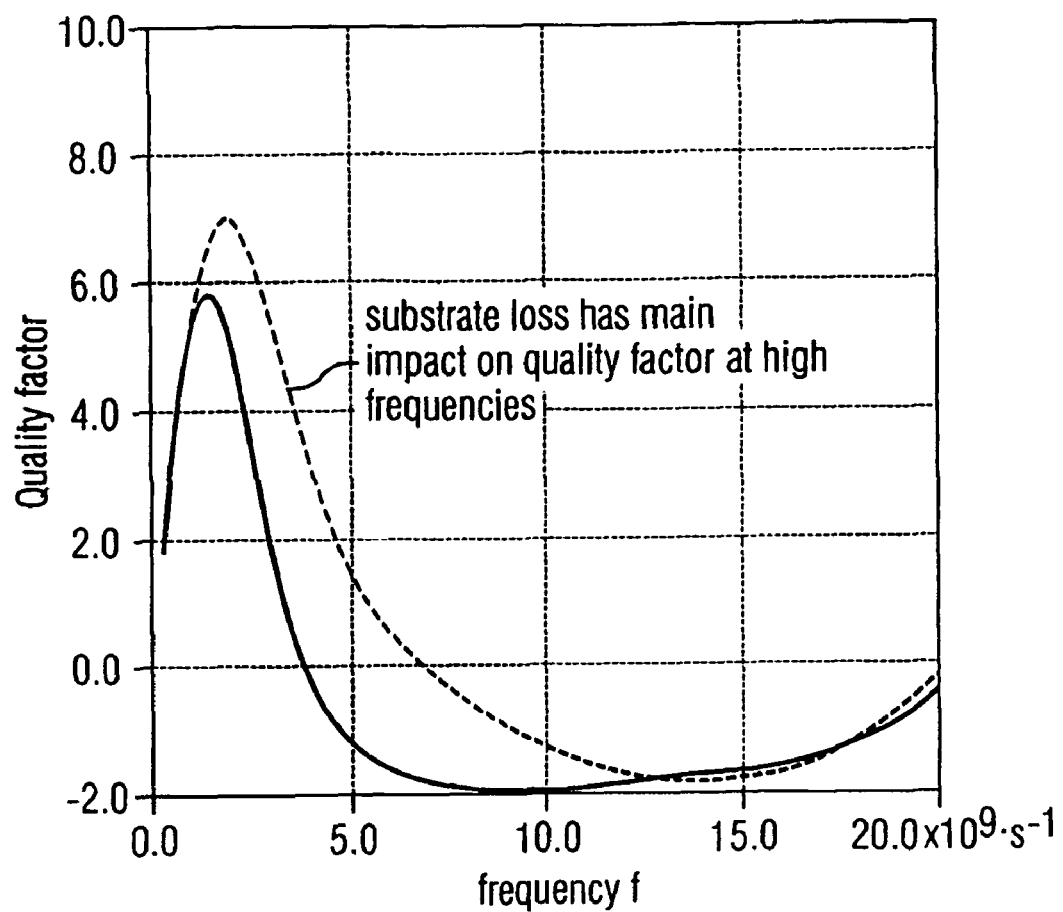

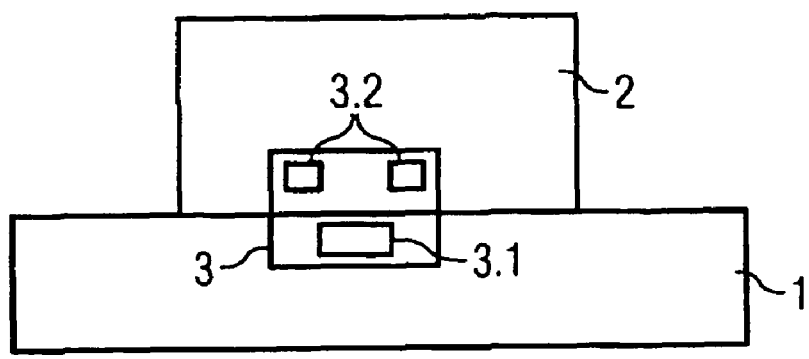
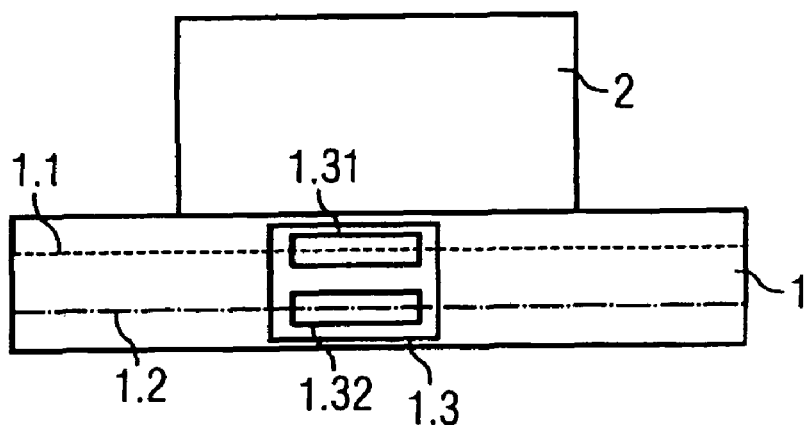
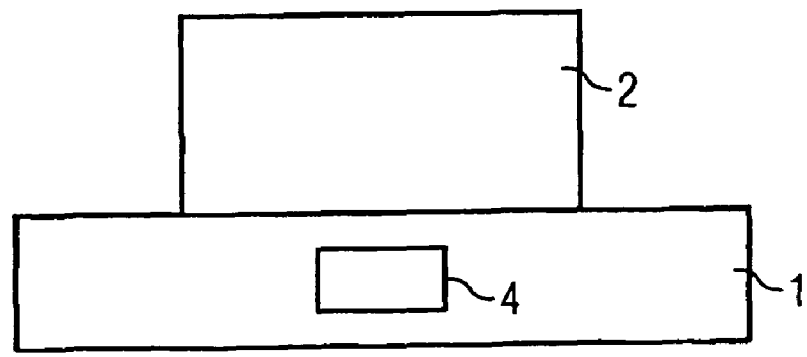

MICROCHIP ASSEMBLY INCLUDING AN INDUCTOR AND FABRICATION METHOD

PRIORITY CLAIM

This application claims the benefit of priority of German Patent Application No. DE 10 2006 057 332.3, filed Dec. 5, 2006, the contents of which are incorporated by reference herein.

BACKGROUND

1. Technical Field

The present invention relates to microchip assembly. In particular, the present invention relates to an assembly comprising a substrate, a chip mounted on the substrate, and a voltage controlled oscillator circuit, and a method for fabricating the same.

2. Background Information

In the cellular telephone market consumers are demanding an increase of functionality, versatility and usefulness, while at the same time expecting cellular telephone costs to keep decreasing. Electronic devices like cellular telephones utilize a combination of radio frequency (RF) circuits and digital electronics. The RF circuitry is now being integrated into the same chip or a set of chips in order to present the consumer with a compact, light weight, and powerful electronic device.

The effective combination of RF functionality in mainstream digital CMOS technology is the key factor for developing low-power and cost-effective solutions for portable and cellular application devices. One of the crucial RF building blocks to integrate are the high-frequency oscillators, since they normally contain inductors, in particular inductor coils, and their performance depends strongly on the quality factor of the inductors. Over the last years the on-chip integration of the coil has succeeded, achieving the tight phase noise specification for various standards like the Digital European Cordless Telephone (DECT) standard, the Bluetooth standard and even the Global System for Mobile communications (GSM) standard. Today, in most CMOS technologies high quality inductors are provided by processing a thick top Cu layer at the expense of an additional non-standard back-end of line (BEOL) fabrication process. The additional fabrication process is however very expensive. The quality factor of the inductor is determined by the losses in the metal layers and at higher frequencies by the resistive losses in the substrate.

FIG. 1 shows the quality factor of a 6.8 nH integrated inductor on a silicon p⁻ substrate. At lower frequencies, the quality factor is determined by the losses of the metal layers achieving a maximum quality factor Q≈6 at approximately 2 Gigahertz. At higher frequencies the quality factor decreases rapidly due to the losses in the silicon substrate. In a GSM RF transceiver the RF oscillator usually operates at 3.8 GHz and by dividing the signal by 2 and 4, respectively, the LO signal is generated depending whether GSM low-band (GSM850/900) or GSM high-band (PCS/DC1800) is chosen. Therefore, achieving high quality factors at about 3.8 GHz is of crucial importance to meet low-phase noise requirements and low-power consumption in an LC-VCO.

BRIEF SUMMARY

An assembly includes a substrate, a chip mounted on the substrate, a voltage controlled oscillator circuit including an inductor and further circuit elements. The inductor is mounted on or in the substrate, and the further circuit elements are mounted on or in the chip. An assembly is disclosed that includes a substrate including a first metallization plane and a second metallization plane, a chip mounted on the substrate, and an inductor mounted on or in the substrate. The inductor includes a first inductor portion in the first metallization plane and a second inductor portion in the second metallization plane. An assembly is also disclosed including a substrate, a chip mounted onto the substrate, and a transformer formed at least in part on or in the substrate.

BRIEF DESCRIPTION OF THE DRAWINGS

Embodiments of the invention are better understood with reference to the following drawings.

FIG. 1 is a diagram for illustrating the dependency of the quality factor of an inductor from the frequency.

FIG. 2 is a schematic drawing of an example assembly.

FIG. 3 is a schematic drawing of a second example assembly.

FIG. 4 is a schematic drawing of a third example assembly.

DETAILED DESCRIPTION

Figure 5:
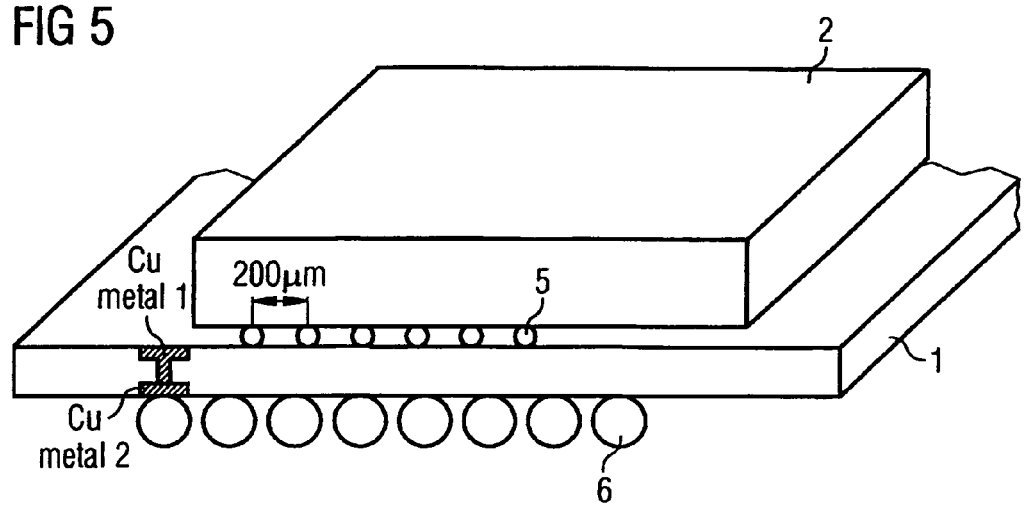
FIG. 5 is an example integrated circuit flip-chip mounted on a substrate by a ball grid array.

The aspects and embodiments of the invention are described with reference to the drawings, wherein like reference numerals are generally utilized to refer to like elements throughout. In the following description for purposes of explanation numerous specific details are set forth in order to provide a thorough understanding of one or more aspects of embodiments of the invention. It may be evident, however, to one skilled in the art that one or more aspects of the embodiments of the invention may be practiced with a lesser degree of the specific details. In other instances, known structures and devices are shown in block diagram form in order to facilitate describing one or more aspects of the embodiments of the invention. The following description is therefore not to be taken in a limiting sense, and the scope of the invention is defined by the appended claims.

An assembly comprising a substrate and a chip mounted on the substrate is described below as related to different embodiments. Chips may be any type of integrated circuits comprising any configuration and number of circuit elements. The chip can comprise one or more metallization layers and the circuit elements can be arranged in one or several of the metallization layers of the chip. The substrate may be any type of substrate which is able to support the chip. In particular, the substrate may be a printed-circuit board (PCB), for example. The substrate may be also any other substrate, e.g. ceramic substrate, glass substrate, polymer substrate. The substrate may also be a so-called interposer which may be arranged between the chip and a printed-circuit board (PCB), for example. As an example of surface mount chips, ball-grid array (BGA) and column-grid array (CGA) chips or chip modules have used arrays of solder balls or columns (sometimes referred to as cylinders) as input and output connection. In this application, the term "balls" or "bumps" will be used generically to refer to any balls, bumps, columns, cylinders or other suitable connections used as surface mount interconnects. With a dense array of solder balls covering one surface of a substrate or chip, BGA and CGA modules can provide a large number of input and output connections to the chip without using excessive space. In many applications the BGA or CGA technology is used in connection with the flip-chip concept. When the chips or modules are connected to the system board, the chips are flipped over and placed so that the array of solder balls are aligned with the corresponding array of landing pads on the substrate or system board. The chip and system board are then heated, allowing the solder paste to melt and flow for establishing the physical and electrical connection between the chip and the substrate or system board. In this application, the term "flip-chip" will be used generically to refer to a chip having contact elements, the chip being mounted onto a substrate with contact elements facing the substrate.

FIG. 2 is a schematic drawing of an assembly. FIG. 2 shows a side view of an assembly of a substrate and a chip. The assembly comprises a substrate 1 which may be a printed-circuit board (PCB), for example. The substrate, however, may also be any one of the substrates mentioned above, e.g. a ceramic, a BGA etc. Instead of using a PCB it is also possible to use a board or substrate having circuits which are not printed onto the board or substrate but which are deposited by any deposition procedures which are well known in the prior art. The assembly also comprises a chip 2 which is mounted on the substrate 1. The assembly also comprises a voltage controlled oscillator circuit 3. The voltage controlled oscillator circuit 3 is arranged in part in the chip 2 and in the other part in the substrate 1. The voltage controlled oscillator circuit 3 comprises an inductor 3.1 which is arranged in the substrate 1 and further circuit elements 3.2 which are arranged in the chip 2. The inductor 3.1 is preferably made of a coil.

The substrate 1 may comprise a metallization layer and the inductor 3.1 may comprise a portion within the metallization layer. The substrate 1 may also comprise further metallization layers and the inductor 3.1 may comprise portions which are provided in one several of these further metallization layers. Details of how inductors may be formed from F one or several metallization layers will be disclosed below, e.g. in the FIGS. 6(a)-(b), 7(a)-(b), 8(a)-(b), and 9. The chip 2 may be mounted on the substrate 1 in the so-called flip-chip manner, i.e. by turning the chip upside down and mounting it with its upper surface onto the substrate 1. The mounting may be done with contact elements like ball grids (not shown) which have been pre-fabricated on the surface of the substrate 1 or on the surface of the chip 2 or on both.

FIG. 3 is a schematic drawing for illustrating a second example assembly. FIG. 3 shows a side view of an assembly of a substrate and a chip. The assembly comprises a substrate 1 which may be a printed-circuit board (PCB), for example. The assembly also comprises a chip 2 which is mounted on the substrate 1. The substrate 1 comprises a first metallization plane 1.1 and a second metallization plane 1.2. The substrate 1 further comprises an inductor 1.3 which is mounted in the substrate 1. The inductor 1.3 is preferably made of a coil.

The inductor 1.3 comprises a first inductor portion 1.31 in the first metallization plane 1.1 and a second inductor portion 1.32 in the second metallization plane 1.2. The first metallization plane 1.1 may be coplanar with the upper surface of the substrate 1 and the second metallization plane 1.2 may be a plane parallel to the first metallization plane within the substrate 1. The second metallization plane may also be coplanar with the lower surface of the substrate 1. The substrate 1 may also comprise further metallization planes. In addition the inductor 1.3 may have further inductor portions provided in one or more of these further metallization planes. The chip 2 may be mounted on the substrate 1 in the flip-chip manner as explained above in connection with FIG. 2. The inductor 1.3 may be electrically coupled to a circuit section of the chip 2. Again, details of how inductors may be formed from one or several metallization layers will be disclosed later, e.g. in the FIGS. 6(a)-(b), 7(a)-(b), 8(a)-(b), and 9.

Referring to FIG. 4 there is shown a schematic drawing for illustrating an embodiment of an assembly according to a third aspect. FIG. 4 shows a side view of an assembly of a substrate and a chip. The assembly comprises a substrate 1 which may be a printed-circuit board (PCB), for example. The assembly also comprises a chip 2 which is mounted on the substrate 1. The assembly also comprises a transformer 4 formed in the substrate 1. The transformer 4 may be electrically coupled to a circuit section of the chip 2. The transformer 4 may be electrically coupled to a circuit section of the chip 2. Details of how transformers may be formed from one or several metallization layers will be disclosed later, e.g. in the FIGS. 10 and 11.

The substrate 1 may comprise a metallization layer and the transformer 4 may comprise a portion within the metallization layer. The substrate 1 may also comprise further metallization layers and the transformer 4 may comprise portions which are provided in one or several of these further metallization layers. The chip 2 may be mounted on the substrate 1 in the so-called flip-chip manner as described above, i.e. by turning the chip 2 upside down and mounting it with its upper surface onto the substrate 1. The mounting may be done with contact elements like ball grids (not shown) which have been pre-fabricated on the surface of the substrate 1 or on the surface of the chip 2 or on both.

Referring to FIG. 5 there is shown a schematic drawing of an example assembly which may be used in connection with either one of the example assemblies shown in FIGS. 2 to 4. FIG. 5 shows a perspective view of an assembly of a substrate and a chip. The assembly comprises a substrate 1 which may be a printed-circuit board (PCB), for example. The assembly also comprises a chip 2 which is mounted on the substrate 1. The chip 2 is mounted on the substrate 1 in the flip-chip manner as described above in connection with FIG. 2 wherein an array of bumps 5 is used which has been pre-fabricated on the upper surface of the substrate 1 or the upper surface of the chip 2 or on both.

The substrate 1 comprises a first metallization layer which is in the plane of the upper surface of the substrate 1 and a second metallization layer which is in the plane of the lower surface of the substrate 1. The two metallization layers are interconnected by at least one via connection connecting a pad "Cu metal 1," in the first metallization layer to a pad "Cu metal 2" in the second metallization layer. The distance between adjacent bumps 5 may be about 200 μm, in which case the package as shown in FIG. 5 is also called a low-profile fine pitch flip-chip ball grid array package (S-LF$^2$ BGA package). An array of balls 6 is provided on the lower surface of the substrate 1 for electrically connecting the substrate 1 to a further substrate like a printed-circuit board (PCB). The substrate 1 may be an interposer as described above.

The assembly as shown in FIG. 5 may be used in connection with the embodiment of FIG. 2 wherein a voltage controlled oscillator is provided comprising an inductor and further circuit elements and wherein the inductor is arranged in the first metallization layer of the substrate 1 and the further circuit elements are arranged in the chip 2 and wherein the inductor and the further circuit elements are electrically connected by the bumps 5. The assembly as shown in FIG. 5 may also be used in connection with the embodiment of FIG. 3 wherein an inductor, in particular an inductor coil, is provided in the substrate 1 and a first portion of the inductor, in particular a first part of the electrical winding or windings is provided in the first metallization layer and a second portion of the inductor, in particular a second part of the electrical winding or windings is provided in the second metallization layer. The assembly as shown in FIG. 5 may also be used in connection with the embodiment of FIG. 4 wherein a transformer is provided in the substrate 1 wherein the electrical coils of the transformer are arranged in one or both of the first and second metallization layers.

Figure 6A:
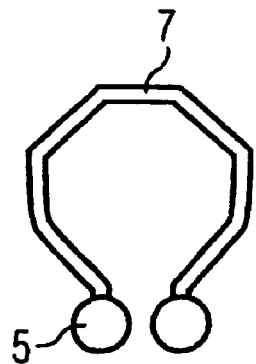
FIGS. 6(a)-(b) illustrate an inductor as part of an assembly.
Figure 6B:
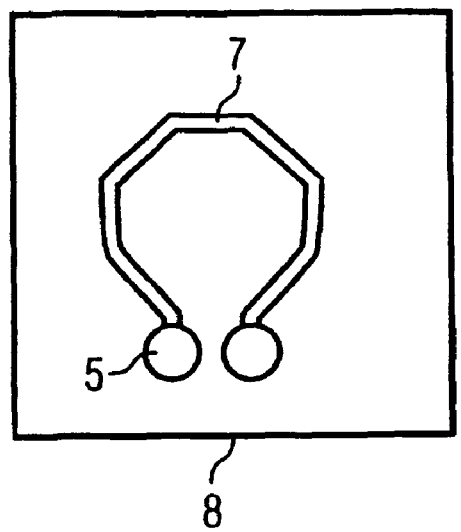

Referring to FIGS. 6(a)-(b) there is shown a further example of an inductor which may be used in connection with an embodiment of an assembly according to the first aspect. FIG. 6a shows a top view of the inductor which is formed on a substrate (not shown). The inductor as shown in FIG. 6a is comprised of a coil having a symmetrical form consisting of a single winding 7. The winding 7 is connected between two bumps 5 which may be part of the array of bumps 5 as shown in FIG. 5 connecting the chip 2 and the substrate 1. The winding 7 may be arranged on the surface of a substrate as the substrate 1 as shown in FIG. 5 wherein the winding 7 may be deposited by printing on the surface of the substrate 1. In FIG. 6b there is shown an additional ground shield 8 which is comprised of a metallic layer or an electrically conductive layer arranged in a further metallization layer below the metallization layer of the winding 7. The further metallization layer may be a layer within the substrate or it may also be in the plane of the lower surface of the substrate. The ground shield 8 shields the inductor with the winding 7 from electrical interference signals.

Figure 7A:
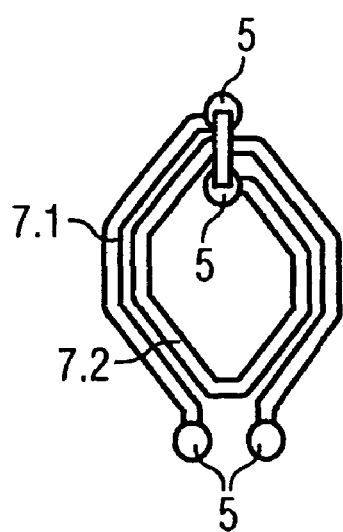
FIGS. 7(a)-(b) illustrate a further example inductor as part of an assembly.
Figure 7B:
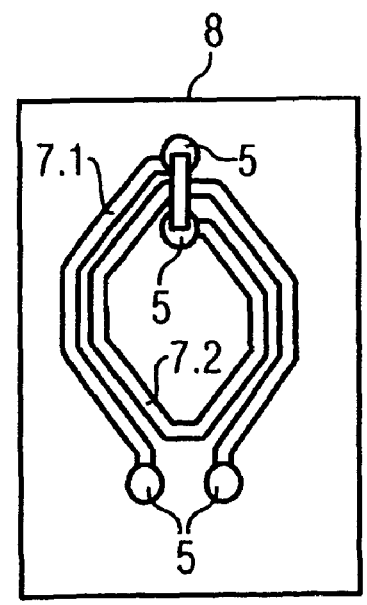

Referring to FIGS. 7(a)-(b) there is shown a further example of an inductor which may be used in connection with an embodiment of an assembly according to the first aspect. FIG. 7a shows a top view of the inductor which is formed on a substrate (not shown). The inductor as shown in FIG. 7a consists of a coil with two windings 7.1 and 7.2 which are arranged in one and the same metallization layer on a surface of a substrate as shown in FIG. 5, for example. The two windings 7.1 and 7.2 are connected between two bumps 5 which are part of the array of bumps 5 as shown in FIG. 5, for example. The windings 7.1 and 7.2 may be arranged on the surface of the substrate 1 as shown in FIG. 5. The windings 7.1 and 7.2 may be deposited by printing on the surface of the substrate 1. Two further bumps 5 of the array of bumps 5 are used for an electrical connection between two points of the coil. Between the two further bumps 5 there is provided a metal connection line which is arranged on the surface of the chip so that it bridges a portion of the coil as the coil is arranged on the surface of the substrate and there is a distance between both surfaces. In FIG. 7b there is shown an additional ground shield 8 which is comprised of a metallic layer or an electrically conductive layer arranged in a further metallization layer below the first metallization layer of the winding 7. The further metallization layer may be a layer within the substrate or it may also be in the plane of the lower surface of the substrate. The ground shield 8 shields the inductor with the winding 7 from electrical interference signals.

Figure 8A:
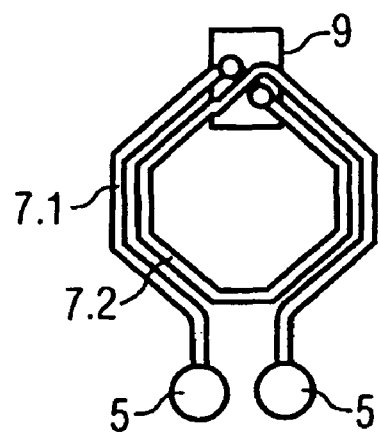
FIGS. 8(a)-(b) illustrate a further example inductor as part of an assembly.
Figure 8B:
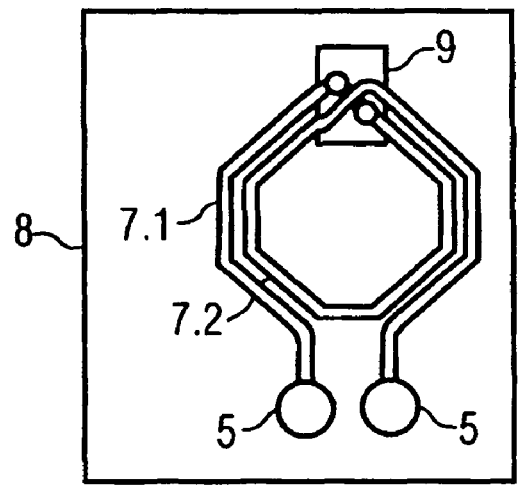

Referring to FIGS. 8(a)-(b) there is shown a further example for an inductor which may be used in connection with an embodiment of an assembly according to the second aspect. FIG. 8a shows a top view of the inductor which is formed on a substrate (not shown). The inductor as shown in FIG. 8a consists of a coil with two windings 7.1 and 7.2 which are connected between two bumps 5 of an array of bumps 5 arranged between the substrate 1 and the chip 2 as depicted in FIG. 5, for example. The two electrical windings 7.1 and 7.2 are arranged essentially in a first metallization plane on the surface of the substrate. However, part of the inductor is arranged in a second metallization plane of the substrate below the first metallization plane. The second metallization plane may comprise a metallization layer 9 which is connected to the first metallization plane by two via connections (black circles). The via connections and the metallization layer 9 allow for a cross-over between the electrical windings 7.1 and 7.2, that is to say, the first electrical winding 7.1 underpasses the second electrical winding 7.2 by use of the via connections and the metallization layer 9. Instead of the metallization layer 9 there can also be provided an electrical wire connecting the two via connections in the second metallization plane. In FIG. 8b there is shown an additional ground shield 8 which is comprised of a metallic layer or an electrically conductive layer arranged in a further metallization layer below the second metallization layer. The further metallization layer may be a layer within the substrate or it may also be in the plane of the lower surface of the substrate. The ground shield 8 shields the inductor with the winding 7 from electrical interference signals.

Figure 9:
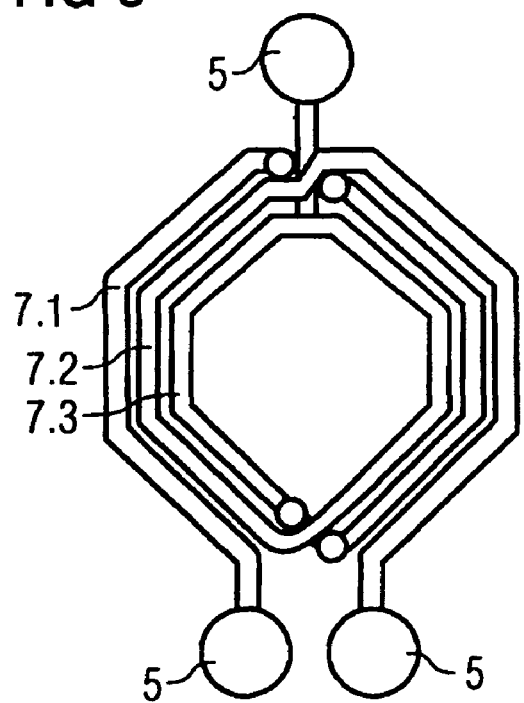
FIG. 9 is a further example inductor as part of an assembly.

Referring to FIG. 9 there is shown a further example of an inductor which may be used in connection with an example assembly. FIG. 9 shows a top view of the inductor which is formed on a substrate (not shown). The inductor as shown in FIG. 9 consists of a coil with three windings 7.1, 7.2 and 7.3 which are connected between two bumps 5 of an array of bumps 5 arranged between the substrate 1 and the chip 2 as depicted in FIG. 5, for example. The substrate comprises a first metallization layer on the upper surface and one further metallization layer below the first metallization layer in order to allow the formation of the three electrical windings 7.1, 7.2 and 7.3. The cross-over of electrical lines is accomplished by the use of via connections (black circles) between the first metallization plane and the further metallization plane as described above in connection with FIG. 8. Halfway along the windings there is provided a tap connected with a further bump 5 of the array of bumps 5. However, the tap and the further bump 5 are only exemplary and can also be omitted.

According to the principle as shown in the embodiments depicted in FIGS. 8(a)-(b) and 9, it is possible to fabricate inductors comprising four and even more windings. The step from two to three windings, i.e. from FIG. 8a to FIG. 9 is to add a further cross-over between electrical lines running towards each other. The example of FIG. 8a comprises two windings and one cross-over wherein after having passed the cross-over the electrical lines are connected to each other in a lower part of the inductor. In the example of FIG. 9, in order to add a further winding this connection is replaced by a further cross-over. After having passed this further cross-over, the electrical lines are connected to each other in an upper part of the inductor wherein this connection is at the same time connected with the tap leading to the further bump 5. If one wants to have a fourth winding, then this connection should be replaced by a further cross-over. In this way in general an inductor having n windings can be fabricated by providing n−1 cross-overs.

Figure 10:
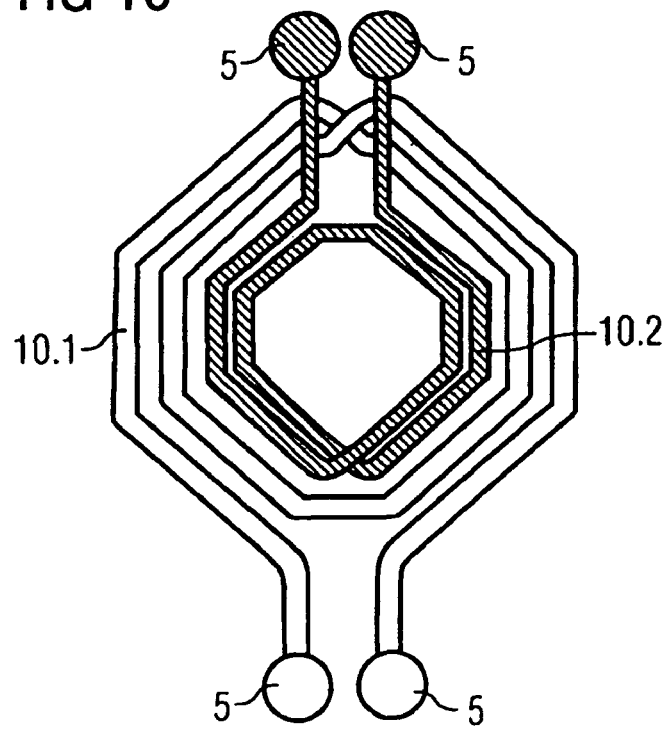
FIG. 10 is an example transformer as part of an assembly.

Referring to FIG. 10 there is shown an example of a transformer which may be used in connection with an assembly according to the third aspect. FIG. 10 shows a top view of the transformer which is formed on a substrate (not shown). The transformer as shown in FIG. 10 consists of two coils 10.1 and 10.2, each coil comprising two windings, respectively. Each one of the two coils 10.1 and 10.2 is respectively connected between two bumps 5 of an array of bumps 5 arranged between the substrate 1 and the chip 2 as depicted in FIG. 5, for example. The cross-over of electrical lines is again accomplished by the use of via connections (not shown) between a first metallization plane and a further metallization plane as described above in connection with FIGS. 8 and 9. The substrate preferably comprises a first metallization plane at the surface of the substrate and one further metallization plane within the substrate used for the cross-overs.

Figure 11:
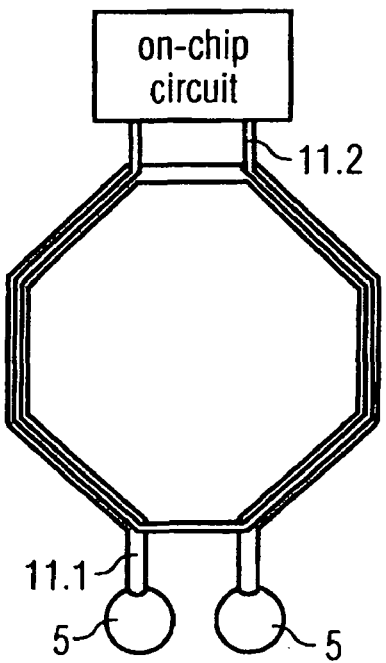
FIG. 11 is a further example transformer as part of an assembly.

FIG. 11 illustrates a further example of a transformer which may be used in connection with an assembly. FIG. 11 shows a top view of the transformer which is formed on a substrate (not shown). The transformer as shown in FIG. 11 consists of two coils 11.1 and 11.2, each coil comprising one winding, respectively. A first coil 11.1 of the two coils is arranged on the substrate and connected between two bumps 5 of an array of bumps 5 arranged between the substrate 1 and the chip 2 as depicted in FIG. 5, for example. A second coil 11.2 of the two coils is arranged on the chip and connected with an electrical circuit in the chip. The substrate is preferably a two-layer substrate.

It is therefore intended that the foregoing detailed description be regarded as illustrative rather than limiting, and that it be understood that it is the following claims, including all equivalents, that are intended to define the spirit and scope of this invention.

The invention claimed is:

1. An assembly, comprising:
    a substrate;
    a chip mounted on the substrate and electrically connected thereto by contact elements;
    a voltage-controlled oscillator circuit, including an inductor and a circuit element; and
    wherein the inductor comprises one or more windings integrated within one or more metallization planes in the substrate and electrically connected to the circuit elements by the contact elements, and the circuit element is integrated with the chip, and wherein the one or more windings include cross over structures where one winding portion overlaps another winding portion between vias of the substrate.

2. The assembly of claim 1, wherein the voltage controlled oscillator circuit includes an LC oscillator circuit, the LC oscillator circuit comprising the inductor.

3. The assembly of claim 1, wherein the chip is mounted onto the substrate with the contact elements facing the substrate.

4. An assembly comprising:
    a substrate;
    a chip mounted on the substrate by way of a plurality of connection elements comprising a ball grid array operable to mount the chip on the substrate; and
    a voltage-controlled oscillator circuit, including an inductor and a circuit element,
    wherein the inductor is integrated with the substrate and includes cross over structures where one inductor portion overlaps another inductor portion between vias of the substrate, and wherein the circuit element is integrated with the chip, and wherein the inductor is electrically connected with the circuit element through a connection to two of the plurality of connection elements.

5. The assembly of claim 4, wherein the substrate includes at least one metallization plane, and the inductor includes at least one winding arranged in the metallization plane.

6. The assembly of claim 5, wherein the substrate comprises a first metallization plane and a second metallization plane, and the inductor comprises a first winding in the first metallization plane and a second winding in the second metallization plane.

7. A method for fabricating an assembly, comprising:
    providing a substrate;
    providing a chip;
    providing a voltage-controlled oscillator circuit including an inductor and a circuit element;
    forming the inductor having windings integral with one or more metallization planes in the substrate, wherein the windings form cross over structures where one winding portion overlaps another winding portion between vias of the substrate;
    forming the circuit element integral with the chip;
    forming contact elements and mounting the chip onto the substrate with the contact elements; and
    electrically connecting the inductor to the circuit elements with the contact elements.

8. The method of claim 7, further comprising mounting the chip onto the substrate with the contact elements facing the substrate.

9. A method for fabricating an assembly, the method comprising
    providing a substrate;
    providing a chip;
    forming a plurality of connection elements to mount the chip on the substrate;
    providing a voltage-controlled oscillator circuit including an inductor and a circuit element;
    mounting the chip onto the substrate;
    forming the inductor integral with the substrate, wherein the inductor comprises cross over structures where one inductor portion overlaps another inductor portion between vias of the substrate;
    forming the circuit element integral with the chip; and
    connecting the inductor to the connection elements to thereby electrically connect the inductor to the circuit element.

10. An assembly, comprising:
    a substrate;
    a chip mounted on the substrate and electrically connected thereto by contact elements; and
    a voltage-controlled oscillator circuit, including an inductor and a circuit element;
    wherein the inductor comprises one or more windings integrated within one or more metallization planes in the substrate and electrically connected to the circuit elements by the contact elements, and the circuit element is housed within the chip, and wherein the one or more windings form cross over structures between vias of the substrate.

11. The assembly of claim 10, wherein the chip is mounted onto the substrate with the contact elements facing the substrate.

12. The assembly of claim 10, wherein the substrate comprises a first metallization plane and a second metallization plane, and the inductor comprises a first winding in the first metallization plane and a second winding in the second metallization plane.

* * * * *